(12) United States Patent
Giles

(10) Patent No.: US 6,650,139 B1
(45) Date of Patent: Nov. 18, 2003

(54) MODULAR COLLECTION OF SPARE GATES FOR USE IN HIERARCHICAL INTEGRATED CIRCUIT DESIGN PROCESS

(75) Inventor: Christopher M. Giles, Lafayette, CO (US)

(73) Assignee: LSI Logic Corporation, Milipitas, CA (US)

(*) Notice: Subject to any disclaimer, the term of this patent is extended or adjusted under 35 U.S.C. 154(b) by 168 days.

(21) Appl. No.: 09/885,896

(22) Filed: Jun. 20, 2001

(51) Int. Cl.[7] .............................................. H03K 19/173
(52) U.S. Cl. ............................. 326/38; 326/10; 326/16
(58) Field of Search ............................ 326/9, 10, 16, 326/37–41

(56) References Cited

U.S. PATENT DOCUMENTS 5,087,953 A * 2/1992 Whittaker et al. .......... 257/203
5,485,102 A * 1/1996 Cliff et al. .................. 326/10
6,255,845 B1 * 7/2001 Wong et al. ................ 326/101
6,404,226 B1 * 6/2002 Schadt ....................... 257/203

* cited by examiner

Primary Examiner—Don Le
(74) Attorney, Agent, or Firm—Conley, Rose & Tayon

(57) ABSTRACT

A system and method are presented for using spare gates to repair logic errors in a digital logic IC with a hierarchical physical design. According to the system and method, the spare gates are organized as scalable modules, consisting of varying numbers of identical sub-modules. The scalable modules are not part of the functional circuitry of the IC, but the spare gates within their sub-modules may be incorporated into faulty functional circuitry to correct the logic error. This is accomplished by altering the metalization layer of the IC to reconnect the spare gates, and does not require changing the physical layout (i.e., adding more pins, relocating gates, etc.) of the IC.

18 Claims, 5 Drawing Sheets

MODULAR COLLECTION OF SPARE GATES FOR USE IN HIERARCHICAL INTEGRATED CIRCUIT DESIGN PROCESS

BACKGROUND OF THE INVENTION

1. Field of Invention

This invention relates to digital logic design, and more particularly, to methodologies for correcting design errors.

2. Description of Related Art

Modern digital logic devices offer unprecedented performance. For a variety of digital integrated circuits (IC's), speed, level of integration (i.e. transistors per square centimeter) and capabilities have improved. Moreover, in many cases, these performance improvements have been accompanied by reductions in size, power consumption and cost of the devices. However, these benefits have required greater complexity in digital logic design. Because of this complexity, the investment of time and resources by the manufacturer to design and fabricate a digital logic device has increased. For this same reason, the possibility of a mistake or oversight on the part of the designer has become more likely, and costlier to correct.

Designers have dealt with this situation by incorporating spare logic elements in the digital logic device. The spare elements are not part of the functional circuitry, but are available to be "patched in," if necessary, to correct previously undetected design errors. While populating the IC with unused circuitry may appear inefficient, it is actually a prudent and economical practice. Design errors often go undiscovered until the IC is in an advanced stage of manufacturing, and the alternative to correcting these errors with spare gates is a (typically, quite expensive) complete re-design of the device.

As digital logic devices have continued to evolve, hierarchical design techniques have become valuable as an approach for managing their complexity. At each hierarchical level, logic elements are formed from combinations of simpler elements. At the lowest hierarchical level of the design, the elements include fundamental devices, such as gates and flip-flops. The top level of the design (often referred to as the "parent") defines the interconnection of complex logic elements, each of which is made up of elements defined at lower levels. When elements are utilized at higher levels in a hierarchical design, their internal structure is not visible—they are treated as "black boxes". The hierarchical approach thus simplifies the design process, since the designer must contend only with the complexity within a single hierarchical level. However, it raises a number of issues related to the correction of design errors, and to the optimum allocation and distribution of the spare gates, some of which are briefly discussed below.

The physical arrangement of the logic elements within an IC is referred to as the "layout." When designing an IC, careful consideration must be given to layout, taking into account the effect of signal path lengths on timing, the possibility of interaction between adjacent signals, etc. Once it has been fully laid out, repair of a digital IC with a hierarchical design flow may be difficult or impractical. For example, if an additional signal is required to repair a module, it is generally not possible to simply route another input line to the module; instead, the layout of the module must be modified at a lower level in the hierarchy to include an additional input. If the affected module is used throughout the logic device, such a change can have a significant impact on the entire design.

A further consideration involving spare gates is that their use diminishes the fault testability of the design. Since, by definition, these gates are not part of any functional signal path, their inputs and outputs are not directly controllable or observable. Consequently, the presence of spare gates may limit the testability of the digital logic device.

Yet another concern is that in high-speed digital logic devices, the insertion of a spare gate into a signal path to correct a design error may have an adverse effect on critical device timing, depending on factors such as the resulting increase in path length, or the propagation delay through the spare gate.

An additional issue relates to the simulation of hierarchical digital logic designs. Before a digital logic design is fabricated into a physical device, the designer typically simulates the design. This involves the use of a sophisticated software model that predicts the behavior of the physical device. On the basis of the simulation, the designer may revise his design to correct errors or improve performance. Only after the results of the simulation are satisfactory, is the costly process of manufacturing a physical device begun. A difficulty arises with regard to the simulation of hierarchical designs, however. When spare gates are added to an original design, the length of time required for simulation naturally increases. If spare gates are widely used within a hierarchical design, the cumulative impact on simulation time may be severe.

Another concern applies to the power consumption attributed to the spare gates. Although these gates are not part of the functional circuitry, it is still possible for them to consume current and dissipate power. Therefore, if spare gates are included in a hierarchical digital logic design, it is desirable to employ some method to keep them in a low-power state.

Yet another consideration is the scalability of the spare gate collections used for repair. Generally, the functional modules within a hierarchical logic design vary in size and complexity. Thus, depending on the size of the functional module in which they are deployed, a greater or lesser number of spare gates may be needed. It is therefore desirable that the spare gates collections be readily scalable, commensurate with the size of the functional module in which they are included.

In view of the above considerations, it would be desirable to have a repair module consisting of spare gates. The repair module should be suitable for use in a hierarchical digital logic design. Therefore, it should permit the addition of input and output signals (if needed for repair) to a functional module without requiring a completely new layout. Furthermore, the desired repair module should not limit fault testability or adversely affect device timing. The repair module should also be scalable, so the number of spare gates available is commensurate with the complexity of the functional module being repaired. Unused spare gates within the repair module should not dissipate excessive power. In addition, the addition of multiple instances of the repair module should not adversely affect the time needed for software simulation of the parent design.

SUMMARY OF THE INVENTION

The problems outlined above are addressed by a system for allocating spare gates in the form of scalable repair modules having a fixed input/output layout and suitable for the repair of logic errors in a digital logic design with a hierarchical structure. Such a design is typically composed of independently created functional modules, referred to herein as "submacs." According to the system disclosed herein, each submac contains an appropriately-sized repair module, which is independent of the functional logic of the submac. These scalable repair modules consist of a number (depending on the size of the module) of identical sub-modules. The sub-modules are normally connected in series within their repair module, and at least some of the repair module inputs/outputs (I/O's) are brought out as I/O's of the submac. If repair becomes necessary, these "extra" I/O pins may be used to bring additional signals into or out of the submac.

One of the final steps in the process of fabricating a digital integrated circuit (IC) is metalization, in which a metallic pattern is deposited to interconnect the individual gates. Correcting a design error in a digital IC is simpler if it can be accomplished by altering the metalization pattern, thus changing the connections between existing components, than if it is necessary to actually add components or change their physical relationship. The sub-modules in the various embodiments of the system disclosed herein contain gates commonly required to repair design flaws. When utilized for such repairs, the sub-modules are effectively disassembled, making their constituent gates available to supplement the functional circuitry of the IC. By modifying the metalization pattern, the spare gates within the sub-modules are reconnected, incorporating them into the circuitry needing repair.

In an embodiment of the system disclosed herein, the majority of the spare gates within a sub-module are capable of being stimulated with a test signal, and their response to the test signal is capable of being measured. This is advantageous from the standpoint of fault coverage and testability of the IC. Furthermore, the sub-modules are configured to operate at very high clock speeds, preferably higher than that required for operation of the IC. In addition, the sub-modules receive both a clock signal and a reset signal. Sub-modules respond to a reset signal by assuming a stable state, wherein (in the absence of any input signal), an active clock signal will not produce logic transitions in any of the spare gates within the sub-module. Thus, unless they are being used for repair, spare gates do not contribute appreciably to power consumption in the IC.

Also disclosed herein, is a method for repairing logic errors in a digital logic IC. According to this method, spare gates are allocated in the form of identical sub-modules. Scalable repair modules are created by connecting a selectable number of sub-modules together in series, and these modules are distributed throughout the IC. If repair is necessary, the metalization layer interconnecting the components in the IC is modified so that some of the sub-modules are effectively disassembled and their spare gates incorporated into the circuitry portion in need of repair.

In an embodiment of this method, sub-modules not being used for repair are connected in series within their respective repair module, such that each sub-module in a series receives the output of the previous sub-module and drives the input of the next sub-module. Furthermore, the I/O's of at least some of the sub-modules in a repair module are brought out as I/O's of the repair module itself. These I/O's provide a means of introducing additional signals (if required) for the repair of faulty circuitry within the IC, without the necessity of changing the physical layout to create new pins.

BRIEF DESCRIPTION OF THE DRAWINGS

Other objects and advantages of the invention will become apparent upon reading the following detailed description and upon reference to the accompanying drawings in which.

Figure 1:
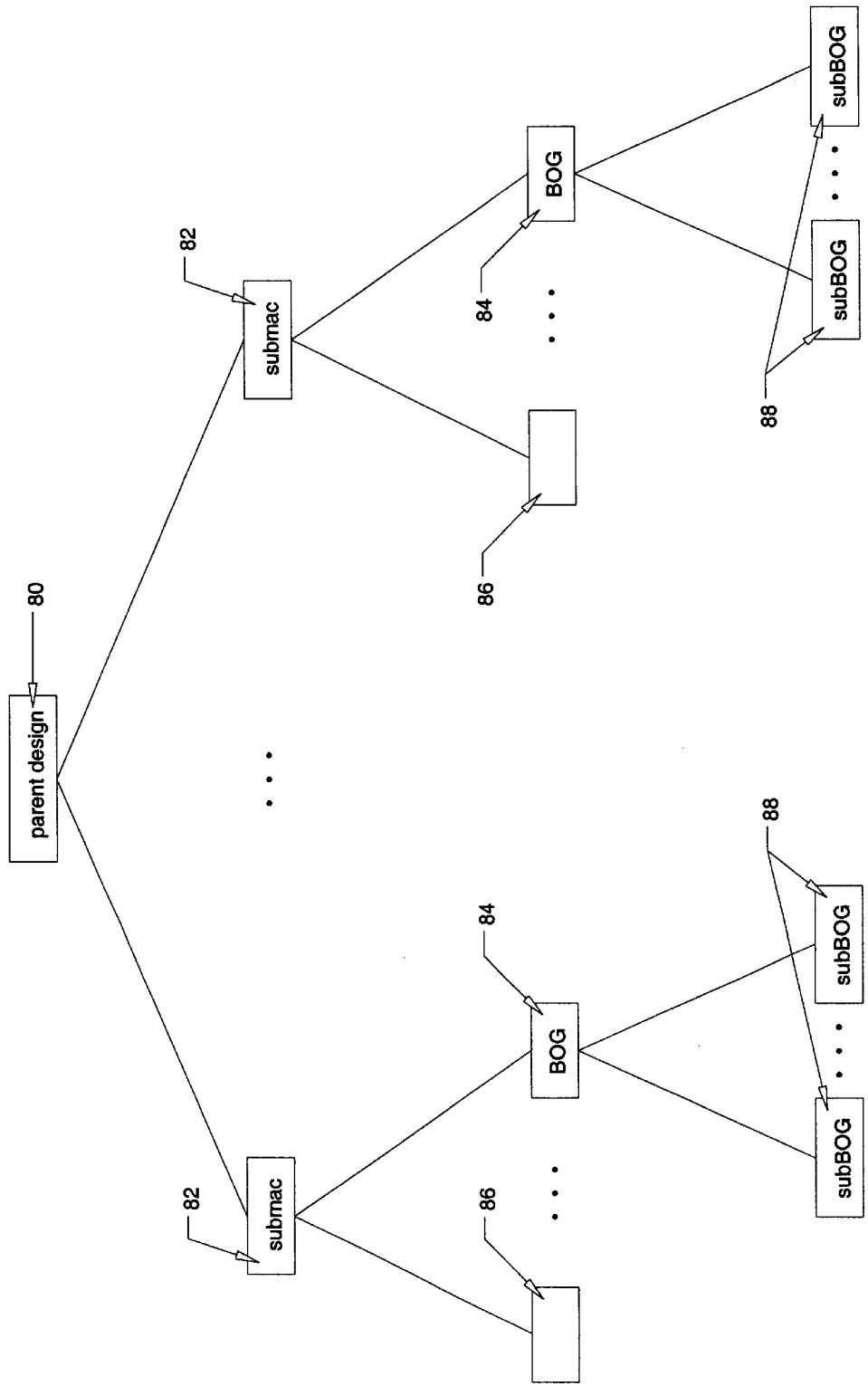
FIG. 1 shows the structural details of an embodiment of the basic spare gates sub-module, known as a sub-bag-of-gates (subBOG)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Modern digital integrated circuits (ICs) are complex devices, which demand the use of sophisticated design and simulation tools. Since the possibility of a design error cannot be completely eliminated, and since the cost and development effort for these devices is so high, designers routinely include spare gates in the design. The spare gates are not part of the functional circuitry of the digital IC, but serve as a resource for the repair of design flaws. In the manufacture of the IC, one of the last steps is metalization—i.e., application of the metal mask to create the actual "wiring" of gates to one another. It is often possible to correct an error in the functional circuitry of the IC by "patching in" some of the spare gates, modifying the metal mask as necessary to route the appropriate signals to and from the spare gates. This is usually much less time consuming and expensive than redesigning the entire IC.

In general, the designer cannot simply disseminate spare gates haphazardly throughout the IC. In high-speed logic, for example, signal propagation time is often critical. Since propagation time depends on the path taken by the signal, the placement of gates in such designs is seldom left to chance. Furthermore, the population of spare gates should be concentrated in regions where complex repairs are most likely. For example, the designer may allocate fewer gates in the vicinity of simple, low-speed circuitry that is considered unlikely to need repair. On the other hand, a greater number of spare gates might be allocated near a complex, high-speed circuit that is more likely to present problems.

The above issues regarding the utilization of spare gates are further complicated by the use of a hierarchical layout methodology in digital integrated circuit design. A hierarchical layout organizes the overall design as a multi-level structure. At each level of the layout, the designer deals with layouts of functional modules, the internal features of which are visible only at a lower level. Once the layout of a functional module is created, the designer may employ it at higher levels in the design as a "black box"—i.e., an operational unit consisting of inputs and outputs, with a function relating them. This reduces the complexity of the layout task, since the designer need not be concerned with the fine structure of the lower level modules. This practice is somewhat analogous to the use of subroutines in high-level programming languages. Once a subroutine has been written and tested, it may be called from various places in a program. The programmer writing the calling program may have no knowledge of (or interest in) the details of how the subroutine operates; all he needs to know is the calling convention—i.e., what arguments the subroutine expects (inputs), and what results it returns (outputs).

A system and method for a spare gates module for the repair of errors in a hierarchical layout of a digital logic design is disclosed herein. In an embodiment, the spare gates repair module (referred to herein as a "bag-of-gates," or "BOG") contains one or more identical sub-modules (referred to herein as a "sub-bag-of-gates," or "subBOG"). An exemplary hierarchical digital logic design is presented, which the overall design (herein referred to as the "parent") is comprised of a number of sub-modules (herein referred to as "submacs"). The submacs are "hardmacros;" i.e., they are laid out before being incorporated into the parent, and their number of inputs, outputs and internal structure are fixed. In an embodiment, each submac contains a BOG. Moreover, the BOGs are scalable; i.e., the number of subBOGs in each BOG is selectable, according to the size and complexity of the submac in which the BOG is contained.

FIG. 1 illustrates the hierarchy of the present exemplary digital logic design. At the top level of the hierarchy is the parent design 80. The parent design 80 itself is composed of one or more submacs 82, occupying the second level of the hierarchical design. At the next lower level, within each submac 82 is a BOG 84 (sized appropriately for its submac), and constituent functional modules 86. At the lowest level, each BOG 84 contains one or more subBOGs 88. In contrast to the allocation of spare gates in the prior art, the system and method disclosed herein organize and assign spare gates in the form of hardmacros within the design hierarchy.

Each BOG is a (possibly unique) combination of sub-BOGs. The BOG can be reconfigured, allowing its constituent gates to be reallocated for use in repairing a defect in the submac it inhabits. In some cases, in order to correct a design flaw it may be necessary to bring additional signals into or out of a submac. If the logic design were not hierarchical, this could be accomplished by routing another signal line to the region of the circuit containing the flaw. However, as stated earlier, each submac is a hardmacro; its input/output configuration is determined at the time of its creation, and is not generally capable of being changed. Therefore, according to the system and method disclosed herein, submacs are designed so that inputs and outputs of the contained BOG are brought out to the top level of the submac. If it becomes necessary to use the BOG to repair the submac, the I/O's are already present, and can be rerouted within the submac.

Figure 2:
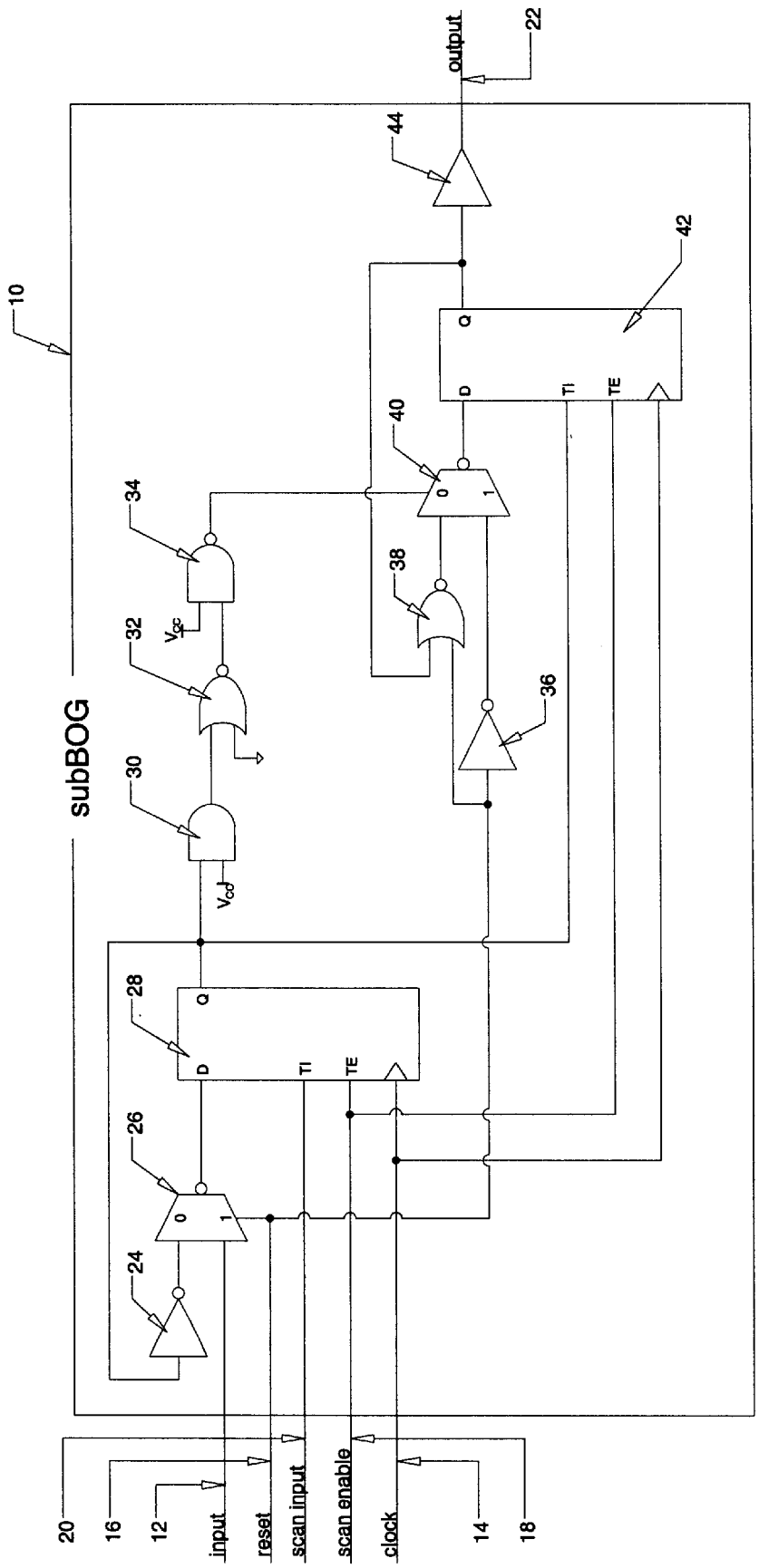
FIG. 2 illustrates a simple bag-of-gates (BOG) configuration.

The internal structure of a subBOG is illustrated in FIG. 2. The subBOG is composed of sequential and combinatorial logic elements, believed to be useful for repairing faulty logic circuits. The subBOG 10 receives an input 12, buffered clock signal 14, and reset 16 from external logic. In addition, a scan input 20, scan enable 18, and output 22 allow the subBOG to be daisy-chained with other subBOGs in the form of a shift register. The subBOG has several features believed to be advantageous for its application within a hierarchical design for a digital logic integrated circuit.

Inverter 24 and input multiplexer 26 are configured to allow the output of flip-flop 28 to be fed back to its input. A similar relationship holds for NOR gate 38, multiplexer 40 and flip-flop 42. It will be apparent that both flip-flops will assume a stable state following the assertion of reset 16. When the reset line 16 goes High, the logic level at the input 12 is presented to the data input of flip-flop 28. Similarly, when reset 16 goes High, inverter 36 presents a logic Low to one input of multiplexer 40, while at the same time, forcing the output of NOR gate 38 to a logic Low. Since both inputs of multiplexer 40 receive a logic Low, the output state of NAND gate 34 is irrelevant, and flip-flop 42 receives a logic Low at its data input. The next rising edge of the clock 14 latches the current logic state of both flip-flops. Once the reset line returns Low, whatever state is present at the output of flip-flop 28 is inverted twice (by inverter 24 and multiplexer 26) and presented at its input—thus, subsequent transitions of the clock 14 do not induce a change in the state of flip-flop 28. Likewise, following reset, the output of flip-flop 42 is at a logic Low. Both inputs of multiplexer 40 then receive a logic High, which is inverted by multiplexer 40 and presented at the input of flip-flop 42. Consequently, flip-flop 42 also does not change state with subsequent transitions of the clock 14. The fact that the logic in the subBOG does not toggle when there is clock activity is an important advantage from the standpoint of power consumption. A characteristic of CMOS (complementary metal oxide semiconductor) logic devices is that their power consumption is related to the amount of switching activity—under steady state conditions, power dissipation is typically quite low.

Another consideration in the use of spare gates is their effect on the timing of the functional logic. The subBOGs are connected in a daisy-chain manner throughout the submacs in the parent design. It is important that the subBOG circuitry not limit the maximum speed of the clock, since that would compromise the functional circuitry of the parent design. In the exemplary embodiment of the subBOG shown in FIG. 2, the buffered clock 14 is applied to flip-flops 28 and 42 located almost directly at the input and output, respectively, of the subBOG. Within a subBOG, the worst-case delay will be that of the output state of flip-flop 28, as it propagates through gates 30, 32 and 34, and then through multiplexer 40 to the input of flip-flop 42. The combined delay due to combinatorial elements 30, 32, 34 and 40 is minimal, so the subBOG is able to operate at clock speeds beyond the maximum operating frequency of the parent design. A further feature of this embodiment of the subBOG is that the reset signal is registered (i.e., reset occurs synchronously with the clock) prior to being delivered to the subBOG. Therefore, it is impossible for a late-arriving reset to cause a timing violation.

Figure 3:
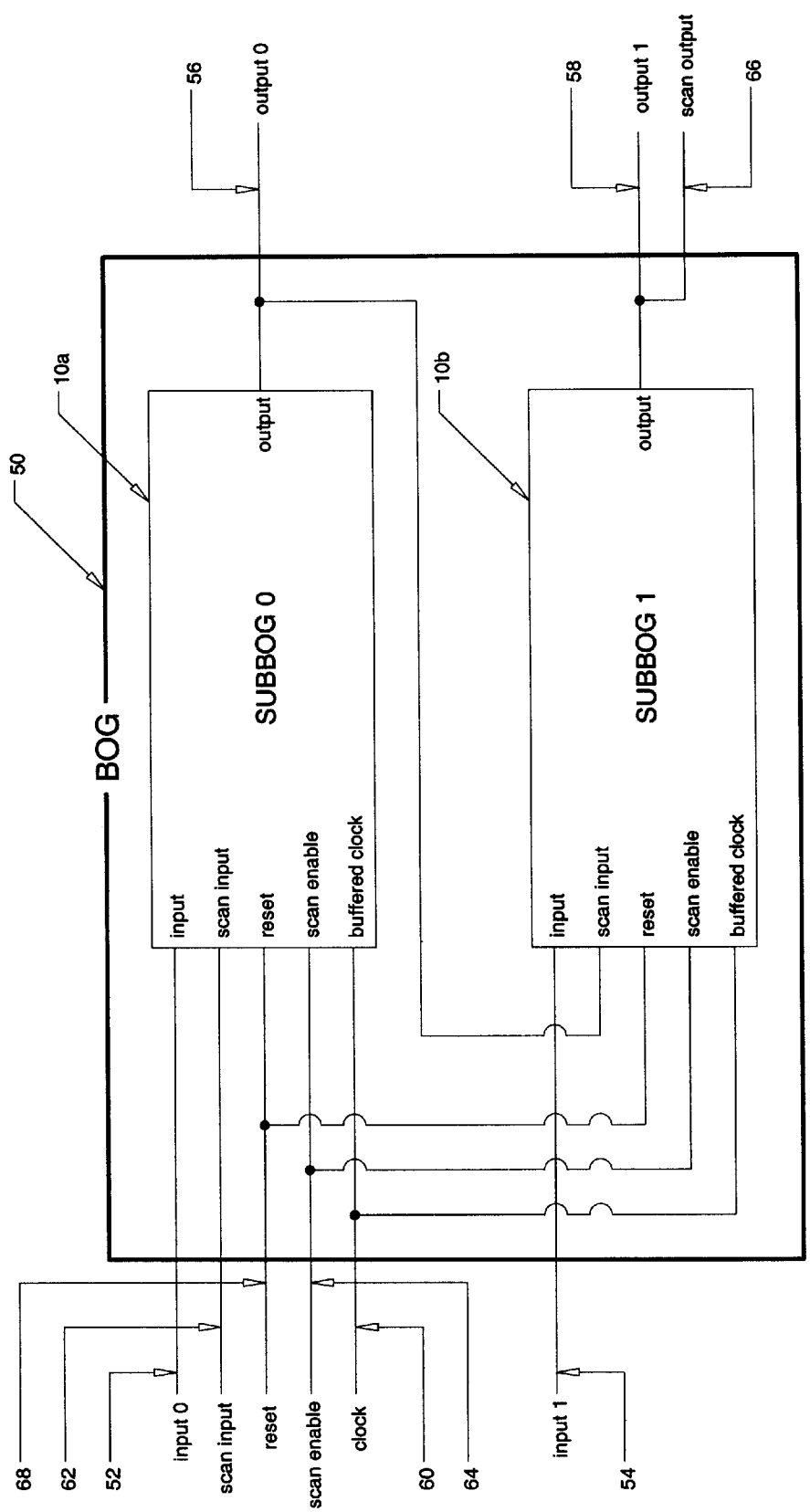
FIG. 3 illustrates a more complex bag-of-gates (BOG) configuration.

The number of subBOGs contained in a BOG is not fixed, but may be chosen by the logic designer. Thus, the BOGs are scalable, and the designer can easily see to it that each submac contains a BOG of appropriate size. FIG. 3 illustrates the structure of a simple BOG 50 consisting of two subBOGs 10a, and 10b. The BOG has two inputs 52 and 54, routed directly to subBOGs 10a and 10b, respectively. Similarly, the two BOG outputs 56 and 58 come directly from the subBOGs. Global clock 60 and reset 68 inputs are applied to both subBOGs. Within the BOG, subBOGs 0 and 1 (10a and 10b, respectively) are series-connected. In addition to appearing as one of the outputs of the BOG, the output of subBOG 0 is routed to the scan input of subBOG 1. When the global scan enable signal 64 is active, the signal present on the scan input 62 to the BOG is received by subBOG 0 and propagated to subBOG 1, to appear at the scan output 66 of the BOG.

As described earlier, BOG inputs and outputs are brought out to the top level of the submacs, in order to reserve I/O connections for additional signals required to repair a design flaw. The more complex the submac, the more spare gates may be required for repair. Consequently, BOGs included in larger or more complex submacs are generally more complex (i.e., contain more subBOGs) than those included in smaller or simpler submacs. However, a complex BOG may need no more I/O connections than a simple BOG, so most of the internal subBOGs are daisy-chained. By fixing the number of inputs and outputs, regardless of internal complexity, the BOG is completely scalable. Alternatively, the internal subBOGs may be configured to provide a greater number of I/O connections to the BOG, where necessary.

Figure 4:
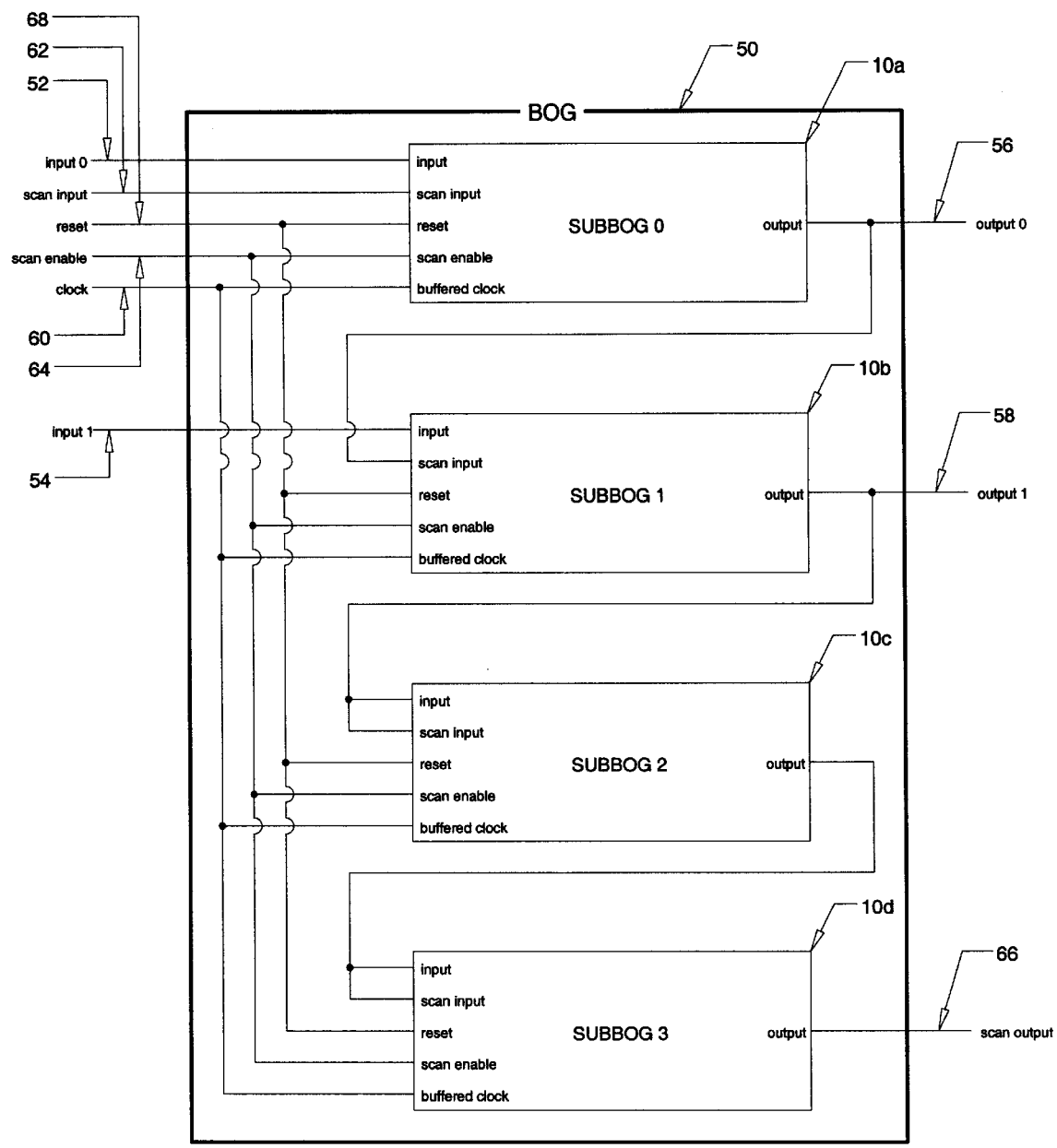
FIG. 4 illustrates the interconnection of several submacros (submacs), each containing a BOG comprising one or more subBOGs.

FIG. 4 illustrates the internal structure of a BOG 50 containing four subBOGs 10a–10d. As with the simpler BOG shown in FIG. 3, the reset 68, clock 60, and scan enable 64 inputs are globally applied to all four of the subBOGs. In this case, however, although it contains four subBOGs, the BOG has only two inputs (52 and 54) and two outputs (56 and 58). This results from the fact that subBOG 2 and subBOG 3 have their inputs and their scan inputs tied together, and receive input signals from subBOG 0 and subBOG 1. Similarly, only the outputs of subBOG 0 and subBOG 1 are brought out of the BOG. A single scan input 62 is applied to all four subBOGs, and a single scan output 66 (from subBOG 3) is brought out of the BOG.

As can be seen in the exemplary embodiments illustrated in FIGS. 3 and 4, the input and output of every subBOG are connected. For each subBOG, either its input and output are brought out to the top level of the submac, in which case the subBOG is connected to an external circuit within the parent design, or they are tied to other subBOGs in a daisy-chain within the same BOG. This is an important characteristic from the standpoint of fault coverage.

Although the spare gates are not part of the functional circuitry of the digital logic device, it is important that they be testable. When a digital logic hardmacro is sold to a customer, the manufacturer typically also supplies a list of the spare gates that are not testable. They will be omitted from the customer's test analysis. If a subsequent release of the hardmacro using these cells is performed, it is likely the customer will continue to ignore faults in these cells (which are now part of the functional circuitry), making their tests less effective and allowing malfunctioning ICs to be used.

It can be seen in the subBOG embodiment shown in FIG. 2 that almost all of the gates within the subBOG are connected to signals, such that these gates can be stimulated and tested. Only three input pins are tied off, while the rest can be exercised via a full scan test. This provides a high degree of fault coverage for the spare gates within the subBOG. An example of the daisy-chain connection of the submacs is shown in FIG. 5.

Figure 5:
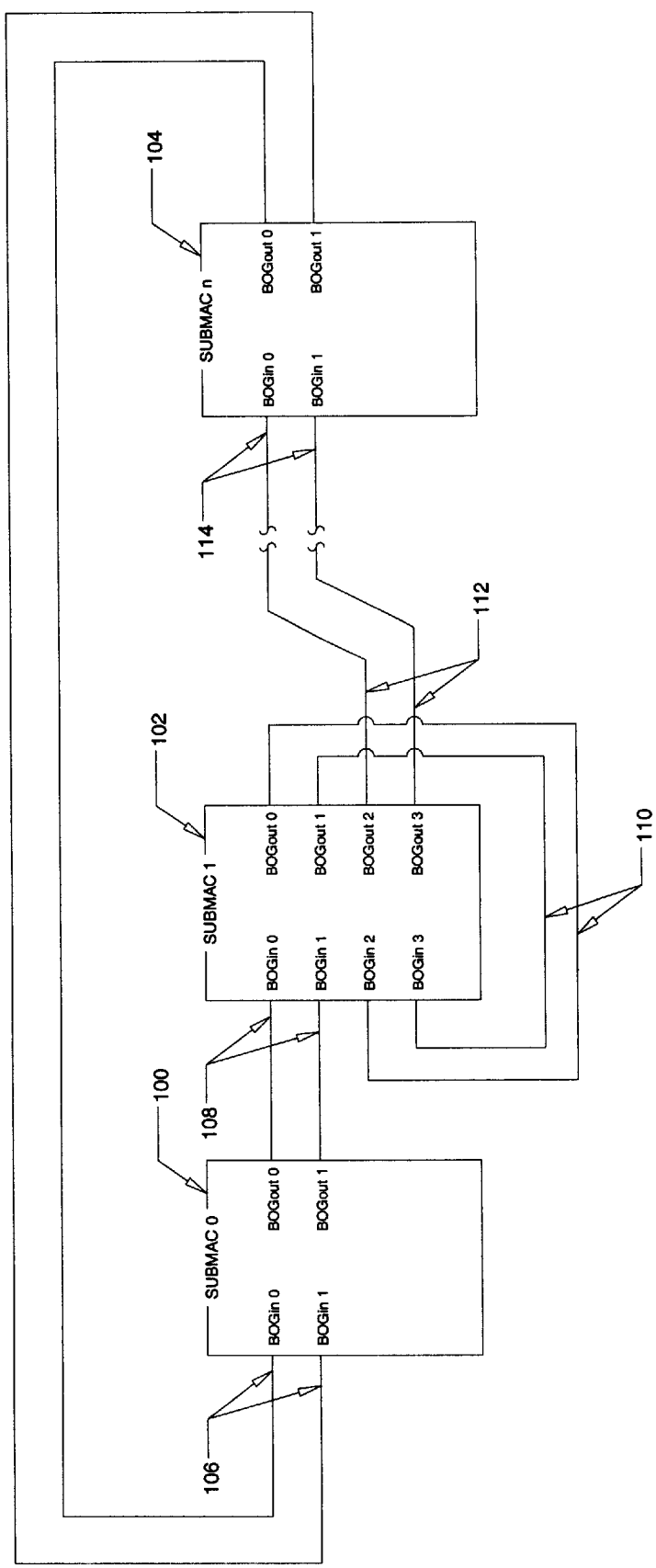
FIG. 5 illustrates the inter-BOG connections between n submacs.

FIG. 5 illustrates the inter-BOG connections between n submacs, of which three submacs (100, 102 and 104) are represented. (For simplicity, the functional connections between the submacs are not shown in FIG. 4.) The BOG outputs of submac 0 100 are coupled to inputs BOGin 0 and BOGin 1 108 of submac 1 102. Submac 1 102 has four inputs and four outputs. The second pair of inputs 110 are coupled to the first pair of outputs, BOGout 0 and BOGout 1, of submac 1 102. Corresponding outputs, BOGout 2 and BOGout 3 112, are coupled to the next submac in the chain (i.e., submac 3). Note that all four inputs and outputs of submac 1 102 are connected to a signal source or recipient. BOGin 0 and BOGin 1 114 of submac n 104 receive the outputs of the previous submac (i.e., submac n−1). The two outputs of submac n are connected back to the inputs 106 of submac 0 100. This serial connection of the subBOGs, together with the design of the spare gates modules themselves (i.e., subBOGs), maximizes fault coverage of the spare gates. Since all subBOG inputs and outputs are registered, submacs may be daisy-chained without concern for cumulative propagation delay, the principal source of delay being the inter-module trace lengths.

Another important consideration during the design of a digital logic integrated circuit is the speed with which simulations can be performed. A digital logic designer relies on software simulations to predict performance, or anticipate problems in a design before it has been committed to silicon. The more complex or detailed the design, the longer such simulations take. Therefore, a simulation based on gate-level descriptions of the digital circuitry is much more computation-intensive than one based on register transfer level (RTL) descriptions. Note, however, that since the spare gates are independent of the functional circuitry of the IC, it is possible to forego gate level simulation of the subBOGs until the design is nearly completed; in the earlier design and debug stages, an RTL level model is sufficient.

The following Verilog code, defining the simple BOG appearing in FIG. 3, illustrates the simplicity of RTL models:

```
always @ (posedge buffered_clock)
   begin
   subbog0_flop0 <= reset ? input_0: subbog0_flop0;
   output_0 <= reset | output_0;
   subbog1_flop0 <= reset ? input_1_flop0;
   output_<= reset | output_1;
   end
```

Because of the modularity of the subBOG, all of the BOGs can be readily modeled at the RTL level, utilizing concise functional descriptions of the subBOGs. This is a significant advantage of the system and method disclosed herein.

It is important that every subBOG be uniquely named within a uniquely named BOG. This causes them to be compiled separately, which allows BOGs to be individually allocated for repair. It is necessary to do this, because when the spare gates in a BOG are used to repair a functional module, the BOG must be redefined to incorporate (at least some of) its gates into the faulty module. If the BOGs were global, rather than unique, the changes would be duplicated in all of the BOGs.

It will be appreciated by those skilled in the art having the benefit of this disclosure that this invention is believed to present a system and method for using spare gates to repair logic errors in a digital logic IC with a hierarchical physical design. Further modifications and alternative embodiments of various aspects of the invention will be apparent to those skilled in the art in view of this description. Details described herein, such as the internal structure of the subBOGs, are exemplary of a particular embodiment. It is intended that the following claims be interpreted to embrace all such modifications and changes and, accordingly, the specification and drawings are to be regarded in an illustrative rather than a restrictive sense.

What is claimed is:

1. A system for repairing errors in digital logic within an integrated circuit, comprising a plurality of modules, wherein each module is scalable in size and contains a selectable number of identical sub-modules connected in series, wherein each sub-module contains a plurality of spare gates selectively coupled to the digital logic to thereby modify the integrated circuit, yet maintaining the functionality thereof, wherein each sub-module is adapted to receive a reset signal registered by a clock, and wherein further clock activity does not change an output state of the sub-module once the reset signal has been registered.

2. The system as recited in claim 1, wherein inputs to a first of the series-connected sub-modules in a scalable module are among inputs of that scalable module, and outputs of a last of the series-connected sub-modules are among outputs of that scalable module.

3. The system as recited in claim 2, wherein connecting sub-modules in series further comprises connecting an input of an $n^{th}$ sub-module in the series to an output of an $n-1^{th}$ sub-module in the series and connecting an output of an $n^{th}$ sub-module to an input of an $n+1^{th}$ sub-module in the series.

4. The system as recited in claim 1, wherein a majority of the spare gates are capable of being stimulated with a test signal and having their response to a corresponding test signal measured.

5. The system as recited in claim 1, wherein each sub-module is adapted to receive a clock signal from the clock and is configured for minimum propagation delay of signals internal to the sub-module.

6. The system as recited in claim 1, wherein the integrated circuit can be modified by changing a portion of a metalization layer of the integrated circuit so that at least some of the sub-modules are disassembled and their spare gates incorporated into a portion of the integrated circuit containing errors, thereby altering its operation.

7. The system as recited in claim 1, wherein spare gates, when disconnected from the digital logic, have substantially no influence on the operation of the integrated circuit.

8. The system as recited in claim 6, wherein a physical layout of the integrated circuit is not changed, apart from the change to the portion of the metalization layer, when the integrated circuit undergoes modification.

9. The system as recited in claim 8, wherein sub-modules comprise identical circuit elements combined in front of and after sequential logic, such that the circuit elements prevent transition or change of state during clock activity.

10. A method for repairing errors in a digital logic integrated circuit, comprising:

allocating spare gates within a plurality of identical sub-modules;

creating a plurality of scalable modules by connecting a selectable number of the plurality of identical sub-modules in series within each of the scalable modules;

providing a reset signal to each of the plurality of identical sub-modules, such that the reset signal is registered by a clock, and wherein further clock activity does not change the output state of any of the plurality of identical sub-modules once the reset signal has been registered;

incorporating at least one scalable module within internal circuitry of the digital logic integrated circuit; and altering an interconnection of circuitry within the digital logic integrated circuit so that spare gates from at least some of the plurality of identical sub-modules within at least some of the plurality of scalable modules are incorporated into a portion of the circuitry requiring repair and modifying its operation, thereby repairing errors therein.

11. The method as recited in claim 10, wherein connecting the selectable number of sub-modules in series further comprises connecting an input of an $n^{th}$ sub-module in the series to an output of an $n-1^{th}$ sub-module in the series, and connecting an output of an $n^{th}$ sub-module to an input of an $n+1^{th}$ sub-module in the series.

12. The method as recited in claim 10, further comprising including among inputs to each of the plurality of scalable modules, inputs to a first of the selectable number of sub-modules connected in series within the respective scalable module.

13. The method as recited in claim 10, further comprising including among outputs of each of the plurality identical scalable modules, outputs of a last of the selectable number of sub-modules connected in series within a respective scalable module.

14. The method as recited in claim 10, further comprising providing a capability to stimulate a majority of the spare gates in each of the plurality of identical sub-modules with a test signal and to measure a response of those gates to said test signal.

15. The method as recited in claim 10, further comprising providing a clock signal to each of the plurality of sub-modules, and configuring each sub-module for minimum propagation delay of signals internal to the sub-module.

16. The method as recited in claim 10, wherein incorporating the at least one scalable module within the internal circuitry of the digital logic integrated circuit further comprises configuring the at least one scalable module so that the selectable number of sub-modules connected in series within the at least one scalable module have substantially no influence on the operation of the digital logic integrated circuit.

17. The method as recited in claim 10, wherein altering the interconnection of circuitry within the digital logic integrated circuit further comprises changing a portion of a metalization layer of the digital logic integrated circuit so that at least some of the plurality of identical sub-modules are disassembled, and their spare gates are incorporated into a portion of the digital logic integrated circuit, modifying its operation to repair errors therein.

18. The method as recited in claim 17, wherein spare gates are incorporated into a portion of the digital logic integrated circuit without modifying a physical layout of the digital logic integrated circuit, apart from the change to the portion of the metalization layer.

* * * * *